United States Patent
Raichelgauz et al.

(10) Patent No.: US 9,691,164 B2
(45) Date of Patent: *Jun. 27, 2017

(54) SYSTEM AND METHOD FOR SYMBOL-SPACE BASED COMPRESSION OF PATTERNS

(71) Applicant: Cortica, Ltd., Tel Aviv (IL)

(72) Inventors: Igal Raichelgauz, New York, NY (US); Karina Odinaev, New York, NY (US); Yehoshua Y Zeevi, Haifa (IL)

(73) Assignee: Cortica, Ltd., Tel Aviv (IL)

( * ) Notice: Subject to any disclaimer, the term of this patent is extended or adjusted under 35 U.S.C. 154(b) by 0 days.

This patent is subject to a terminal disclaimer.

(21) Appl. No.: 15/188,463

(22) Filed: Jun. 21, 2016

(65) Prior Publication Data

US 2016/0328863 A1    Nov. 10, 2016

Related U.S. Application Data

(63) Continuation of application No. 14/929,976, filed on Nov. 2, 2015, now Pat. No. 9,438,270, which is a
(Continued)

(51) Int. Cl.
*G06T 9/00* (2006.01)
*H03M 7/30* (2006.01)
*H03M 7/46* (2006.01)

(52) U.S. Cl.
CPC ............... *G06T 9/00* (2013.01); *H03M 7/30* (2013.01); *H03M 7/3084* (2013.01); *H03M 7/46* (2013.01)

(58) Field of Classification Search
CPC .......... H04L 69/04; H03M 7/30; H03M 7/00; H03M 7/46; H03M 7/3084; G06T 9/00
(Continued)

(56) References Cited

U.S. PATENT DOCUMENTS 5,666,114 A    9/1997  Brodie et al.
5,915,041 A    6/1999  Thielens
(Continued)

FOREIGN PATENT DOCUMENTS

EP    0930787 B1    2/2008
EP    2530843 A2    12/2012
(Continued)

OTHER PUBLICATIONS

Foreign Office Action dated Feb. 23, 2016 from the Korean Intellectual Property Office (KIPO), Korean Patent Application No. 10-2015-7025153.
(Continued)

*Primary Examiner* — Lam T Mai
(74) *Attorney, Agent, or Firm* — M&B IP Analysts, LLC

(57) ABSTRACT

A method and system for symbol-space based pattern compression. The method includes identifying a plurality of basic image symbols in an input sequence; assigning, to each of the plurality of basic image symbols, at least one connecting port; generating an output sequence by replacing each identified basic image symbol with an identification symbol, wherein the output sequence indicates connections between pairs of the plurality of basic image symbols based on the connecting ports, wherein each identification symbol is not a previously used symbol; and storing the output sequence as a data layer.

19 Claims, 7 Drawing Sheets

| Symbol Sequence | Repeats of Symbol Sequence | Replace Symbol | Independent appearances (e.g. BYY and YY are dependent) |
|---|---|---|---|
| HM | 4 | Q | 4 |
| AJ | 4 | W | 4 |
| HG | 4 | Z | 4 |
| LB | 4 | 1 | 4 |
| BH | 4 | 2 | 3 |
| CG | 4 | 3 | 4 |
| YY | 4 | 4 | 4 |
| GR | 3 | 5 | 3 |
| RL | 3 | -- | 2 |
| IR | 3 | 6 | 3 |
| RJ | 3 | -- | 1 |
| JY | 3 | -- | 1 |
| RB | 3 | -- | 1 |
| BJ | 3 | 7 | 3 |
| JN | 3 | -- | 2 |
| HY | 3 | -- | 2 |
| SK | 3 | 8 | 3 |
| GI | 3 | 9 | 3 |
| TH | 3 | -- | 2 |
| HB | 3 | 0 | 3 |
| BN | 3 | -- | 1 |
| JB | 3 | -- | 2 |
| YC | 3 | Ψ | 3 |
| DG | 3 | -- | 2 |
| FR | 3 | Ω | 3 |
| BA | 3 | -- | 1 |
| GB | 3 | -- | 2 |
| YD | 3 | Φ | 3 |
| BR | 3 | β | 3 |

Related U.S. Application Data continuation of application No. 14/573,652, filed on Dec. 17, 2014, now Pat. No. 9,197,244, which is a continuation of application No. 13/874,159, filed on Apr. 30, 2013, now Pat. No. 8,922,414.

(60) Provisional application No. 61/763,554, filed on Feb. 12, 2013.

(58) Field of Classification Search
USPC .................................. 341/50–90; 382/245
See application file for complete search history.

(56) References Cited

U.S. PATENT DOCUMENTS

| | | | |
|---|---|---|---|
| 6,208,273 B1 | 3/2001 | Dye et al. | |
| 6,362,756 B1 | 3/2002 | Shannon | |
| 6,411,229 B2 | 6/2002 | Kobayashi | |
| 7,126,500 B2 | 10/2006 | Adams et al. | |
| 7,546,158 B2 | 6/2009 | Allison et al. | |
| 8,922,414 B2 * | 12/2014 | Raichelgauz | H03M 7/30 341/159 |
| 9,197,244 B2 * | 11/2015 | Raichelgauz | H03M 7/30 |
| 9,438,270 B2 * | 9/2016 | Raichelgauz | H03M 7/30 |
| 2012/0331011 A1 | 12/2012 | Raichelgauz et al. | |

FOREIGN PATENT DOCUMENTS

| | | |
|---|---|---|
| WO | 2012030262 A1 | 3/2012 |
| WO | 2013018816 A2 | 2/2013 |

OTHER PUBLICATIONS

Foreign Office Action for Chinese Patent Application No. 201380030434.X, State Intellectual Property Office of the P.R.C., Nov. 10, 2015.

International Search Report and Written Opinion of the International Searching Authority for related International Patent Application PCT/US2013/046155; Date of Mailing: Dec. 16, 2013.

Japanese Final Office Action for Japanese Patent Application No. 2015-510521, Mailing No. 547046, Mailing Date: Dec. 1, 2015.

Office Action, Japanese Patent Office, Japanese Patent Application No. 2015-510521, Mailing No. 268298, Jun. 16, 2015.

United Kingdom Examination Report under Section 18(3) for Application No. GB1417750.5, Date of Report: Nov. 10, 2015, Concept House, Newport, South Wales.

* cited by examiner

```
GRBBBBRYBRYRYYGRGYRBGRBRGRGGGGRBYRRRYBRRYGYGBY
RYBRBGGGRBBBYYYRBGGBYYYRYBGYYRYGGRYYYGRRYBRYB
YRGBGGYBBBBRRYBGBRRYRBYBGRGGYBBRGGRGRYRBBYYYRY
GYRGBBGBYYRRYRRBGRGYGBBBBYYRGYBYBBGGGGRRRBRGGB
YBBRGBRRBGRBGRGBYYGGYGBRGYRGYRYGGRRYBGGGBGBGR
BBGYYYYGGBRRYYBBBBYYYBYBGRRRYBGBYGGRYRGYBGRY
YRYRGRGRRBGRGBYBRGYRGRYYBYGYRRGRBRYYRYYBGYRBY
YRRYBYYYGYRGBBRGYGGBGYYBBRBBRRBGBGGRYRRRBGGGBR
GRGRGYBYBRGYGYYRGGYBBYRRGGGYGGRYBYYYGRRRRBRGY
YYYYRGBYYYRBRBBGBBBRRBYYGBBYYBRRGRBGYBBGRYGBBB
RGBGYRRRRRGBGBBBBGBYBYGGBGGYBRGGYBBGRRGBBBGRG
```

FIGURE 1

| Symbol Sequence | Repeats of Symbol Sequence | Replace Symbol | Independent appearances (e.g. BYY and YY are dependent) |
|---|---|---|---|
| BYY | 13 | A | 13 |
| BGR | 12 | C | 12 |
| BRG | 12 | D | 12 |
| YYR | 12 | -- | 5 |
| RYB | 11 | -- | 9 |
| RGY | 11 | -- | 5 |
| YYY | 11 | -- | 4 |
| GRG | 10 | -- | 4 |
| RBG | 10 | -- | 5 |
| RRY | 10 | E | 10 |
| YRG | 10 | -- | 9 |
| RGB | 10 | -- | 5 |
| RG | 38 | F | 21 |
| GR | 34 | -- | 9 |
| BG | 34 | H | 22 |
| YB | 33 | I | 19 |
| YR | 32 | J | 20 |
| RY | 30 | K | 11 |
| GB | 30 | -- | 7 |
| GY | 29 | -- | 8 |
| BB | 28 | L | 11 |
| BR | 27 | -- | 8 |
| YY | 27 | -- | 8 |
| BY | 27 | -- | 3 |
| RB | 25 | -- | 3 |
| GG | 25 | M | 15 |
| RR | 25 | N | 13 |
| YG | 21 | O | 11 |

FIGURE 2

```
GRLLRIRJYOFJCDFMGRBJNIRKGOBJIRHMRLAJHGAJYHYJYMKYON
IRIYFHGILBRKHBNJBYCMIDGFRJBAJOYFBHANJRCGOLBAFIIHMG
NRDGBIDBNCCGAMODYFJYMRKHMHCBHYYYYMBRKYILAIYCRK
HBYMKFYCYJYFFNCGBYDYFKIOJFRBKJYYHJARKAOYFBDYMHYI
BRLNHHGRJNHMDFFIYDOYYFGIBJFMYMKAONNDYYYYFAJBRB
HLBNAGBABRFRHICOLDHJNRFHLBHBIYMHGYDGICFLCG
```

FIGURE 3

| Symbol Sequence | Repeats of Symbol Sequence | Replace Symbol | Independent appearances (e.g. BYY and YY are dependent) |
|---|---|---|---|
| YF | 8 | P | 8 |
| YM | 7 | S | 7 |
| JY | 6 | -- | 3 |
| RK | 6 | T | 6 |
| YY | 6 | -- | 4 |
| BR | 5 | -- | 3 |

FIGURE 4

```
GRLLRIRJYOFJCDFMGRBJNITGOBJIRHMRLAJHGAJYHYJSKYONIRI
PHGILBTHBNJBYCMIDGFRJBAJOPBHANJRCGOLBAFIIHMGNRDGBI
DBNCCGAMODPJSTHMHCBHYYYSBTYILAIYCTHBSKFYCYJPFNCG
BYDPKIOJFRBKJYYHJATAOPBDSHYIBRLNHHGRJNHMDFFIYDOYP
GIBJFMSKAONNDYYYPAJBRBHLBNAGBABRFRHICOLDHJNRFHL
BHBISHGYDGICFLCG
```

FIGURE 5

| Symbol Sequence | Repeats of Symbol Sequence | Replace Symbol | Independent appearances (e.g. BYY and YY are dependent) |
|---|---|---|---|
| HM | 4 | Q | 4 |
| AJ | 4 | W | 4 |
| HG | 4 | Z | 4 |
| LB | 4 | 1 | 4 |
| BH | 4 | 2 | 3 |
| CG | 4 | 3 | 4 |
| YY | 4 | 4 | 4 |
| GR | 3 | 5 | 3 |
| RL | 3 | -- | 2 |
| IR | 3 | 6 | 3 |
| RJ | 3 | -- | 1 |
| JY | 3 | -- | 1 |
| RB | 3 | -- | 1 |
| BJ | 3 | 7 | 3 |
| JN | 3 | -- | 2 |
| HY | 3 | -- | 2 |
| SK | 3 | 8 | 3 |
| GI | 3 | 9 | 3 |
| TH | 3 | -- | 2 |
| HB | 3 | 0 | 3 |
| BN | 3 | -- | 1 |
| JB | 3 | -- | 2 |
| YC | 3 | Ψ | 3 |
| DG | 3 | -- | 2 |
| FR | 3 | Ω | 3 |
| BA | 3 | -- | 1 |
| GB | 3 | -- | 2 |
| YD | 3 | Φ | 3 |
| BR | 3 | β | 3 |

FIGURE 6

5LLR6JYOFJCDFM57NITGO76QRLWHGWYHYJ8YON6IPH91T0NJBΨM
IDGΩJBWOP2ANJR3O1AFIIQGNRDGBIDBNC3AMODPJSTQHC24YSBT
YILAIΨT08FΨYJPFN3BΦPKIOJΩBKJ4HJATAOPBDSHYIβLNHH5JNQD
FFIΦOYP97FM8AONND44PWβ21NAGBAβΩHICOLDHJNRFH10ISHGΦ9
CFL3

SYSTEM AND METHOD FOR SYMBOL-SPACE BASED COMPRESSION OF PATTERNS

CROSS REFERENCE TO RELATED APPLICATIONS

This application is a continuation of U.S. patent application Ser. No. 14/929,976 filed on Nov. 2, 2015, now allowed, which is a continuation of U.S. patent application Ser. No. 14/573,652 filed on Dec. 17, 2014, now U.S. Pat. No. 9,197,244. The application Ser. No. 14/573,652 is a continuation of U.S. patent application Ser. No. 13/874,159 filed on Apr. 30, 2013, now U.S. Pat. No. 8,922,414, which claims the benefit of U.S. Provisional Application No. 61/763,554 filed on Feb. 12, 2013. All of the above-referenced applications are hereby incorporated by reference.

TECHNICAL FIELD

The disclosure generally relates to pattern recognition and big-data, and more particularly to systems and methods that make use of pattern recognition techniques and big-data storage and analytics.

BACKGROUND

Recognition of patterns and properly assembling them for storage, preferably in a compact way, is continuously being attempted. However, unless otherwise specified, it cannot be assumed that all patterns are evenly distributed along the data. Because some patterns can be more prominent than others, they are likely to have a larger number of occurrences, while other patterns may be very rare. In addition, some patterns may be correlated to each other, and together form pattern-combinations which may also be very popular. This poses a problem to applications for pattern recognition systems. For example, to retrieve a similarity measurement between two content-segments, it is not enough to consider the number of corresponding patterns, but the probability of occurrence of each pattern should be considered as well. In addition, correlation between patterns should also be considered. For example, if two patterns always appear together, in essence they do not contain more information than a single pattern.

Such an effect, in turn, is detrimental for the scalability and the accuracy of a pattern-recognition system. That is, if the handling of different patterns is spread between multiple machines of the pattern-recognition system, then most machines dealing with "less-popular" patterns will remain inactive, whereas a few machines, processing "popular" patterns, will be overburdened with accesses. It is also impossible to distribute the handling of patterns according to their a-priory probability because of correlations between patterns, of which no assumptions can be made. Furthermore, in general, to scale up a pattern-recognition system it would be preferable to avoid duplication of the pattern-space and the need to hold a copy of the patterns in each machine.

Reduction of multiple symbols, such as a pattern, to a smaller number of manageable symbols that are easily recognizable is performed manually in certain cases. Consider, for example, a sequence of notes that are combined into a chord. A chord is a combination of two or more notes that are played, or otherwise heard as if being played simultaneously. However, the chords are repetitive in nature and hence, in order to reduce the number of notes provided to a performer, the sequence of notes is reduced to a symbol of a chord, which represents the plurality of notes. Hence, the chord marked as C7 means that the performer is to play the root note A, the minor third C, and a perfect fifth E, so that they appear to be played simultaneously. A person can easily translate the symbol of a chord into the specific notes it represents. Similarly, the creation of the mapping between two sets of symbols is performed manually based on specific rules to which rules may be added, deleted or modified as necessary.

It would be advantageous to provide an efficient solution for pattern recognition that overcomes the deficiencies of the prior art, particularly the requirement for human manual intervention in the recognition process.

SUMMARY

Certain embodiments disclosed herein include a method for symbol-space based pattern compression. The method comprises identifying a plurality of basic image symbols in an input sequence; assigning, to each of the plurality of basic image symbols, at least one connecting port; generating an output sequence by replacing each identified basic image symbol with an identification symbol, wherein the output sequence indicates connections between pairs of the plurality of basic image symbols based on the connecting ports, wherein each identification symbol is not a previously used symbol; and storing the output sequence as a data layer.

Certain embodiments disclosed herein also include a system for symbol-space based pattern compression. The system comprises a processing unit; and a memory, the memory containing instructions that, when executed by the processing unit, configure the system to: identify a plurality of basic image symbols in an input sequence; assign, to each of the plurality of basic image symbols, at least one connecting port; generate an output sequence by replacing each identified basic image symbol with an identification symbol, wherein the output sequence indicates connections between pairs of the plurality of basic image symbols based on the connecting ports, wherein each identification symbol is not a previously used symbol; and store the output sequence as a data layer

BRIEF DESCRIPTION OF THE DRAWINGS

The subject matter disclosed herein is particularly pointed out and distinctly claimed in the claims at the conclusion of the specification. The foregoing and other objects, features and advantages of the disclosed embodiments will be apparent from the following detailed description taken in conjunction with the accompanying drawings.

FIG. 1 is an original sequence of symbols having a first symbol space used as an input for processing according to one embodiment.

FIG. 2 is a first level table utilized for mapping and input sequence and for the determination of replacement symbols for sequences of symbols according to one embodiment.

FIG. 3 is a sequence of symbols representing a reduced number of symbols created using a second symbol space larger than the first symbol space according to one embodiment.

FIG. 4 is a second level table utilized for mapping an input sequence and for the determination of replacement symbols for sequences of symbols according to one embodiment.

FIG. 5 is a sequence representing a reduced number of symbols created using a third symbol space larger than the second symbol space according to one embodiment.

FIG. 6 is a third level table utilized for mapping of the input sequence and for the determination of replacement symbols for sequences of symbols according to another embodiment.

FIG. 7 is a sequence representing a reduced number of symbols created using a fourth symbol space larger than the third symbol space according to one embodiment.

FIGS. 8A through 8D are diagrams of the image symbols line, square, circle and triangle respectively and used according to one embodiment.

FIGS. 9A and 9B are higher level image symbols of a "house" and a "chair" respectively, created from basic symbols according to one embodiment.

FIGS. 10A through 10D are basic symbols of a line, a square, a circle, and a triangle respectively, each having corresponding connection ports.

DETAILED DESCRIPTION

Figures 11A, 11B, 11C:
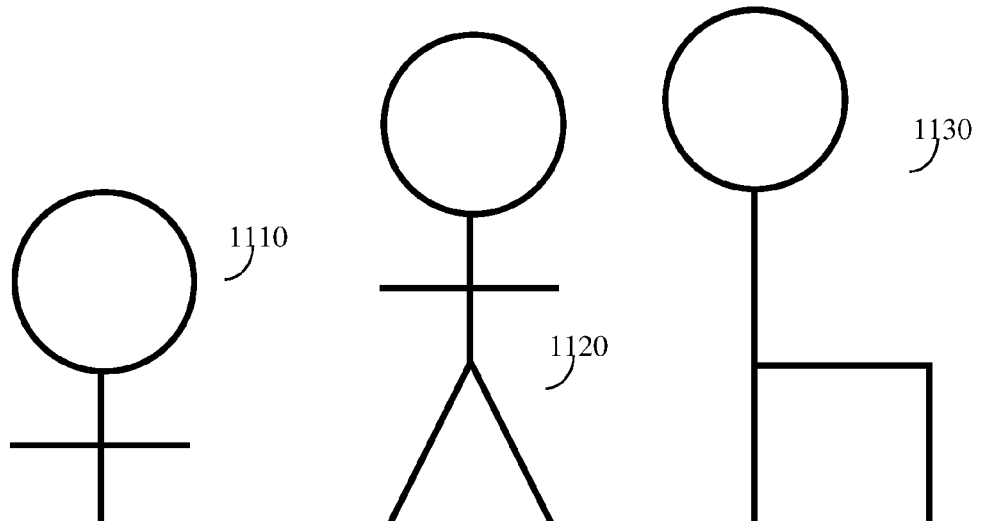
FIGS. 11A through 11C are higher level image symbols of a "man", a "woman" and a "dog", respectively, created from basic symbols according to one embodiment.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

The various techniques disclosed herein allow mapping natural signals and/or features extracted from natural signals to compressed representations in high-dimensional space with properties of repeatability and invariance. Specifically, for a given input space, a plurality of data layers (Cortex) are created respective of the input data that is represented by more symbols, i.e., at least one more symbol than the immediately previous list of symbols, but with a shorter overall length, i.e., a length that is shorter from the immediately preceding length of symbols' sequence.

Accordingly, information is represented in a more compact way and more easily recognized over a symbol-space. The input data may be of an image, video, text, voice and other types of data that can be mapped in a plurality of data layers. In one embodiment, the disclosed techniques can be described as an ability to determine what a "table" is by comparing it to an "ideal table" of a higher data layer. Specifically, a pattern-space is generated that is big enough to be spread across multiple machines (or processors) of a pattern-recognition system, each machine handling a different range in the pattern-space. The pattern-space includes one or more patterns.

According to one embodiment, input "patterns" are received from a mechanism (or system) designed for finding "patterns" in content-segments. The input patterns are loosely defined as arbitrary representations of some features in a content-segment. However, it should be noted that the received "Patterns" are also associated with any information as to what these patterns represent and about the locality of these patterns. A collection of such patterns is referred to herein as a "descriptor". A content segment may be represented by one or more "descriptors". For example, if the content-segment is a 2D image, Patterns may indicate that specific shapes or colors were detected in that image.

According to the disclosed embodiments, the pattern-space of the received input patterns are transformed into a pattern-space that is larger in size, but more balanced, de-correlated, repeatable and invariant as further described in greater detail herein. Specifically, in each descriptor, the original input patterns are replaced with new patterns, which represent combinations of patterns from the original pattern-space. Accordingly, the disclosed techniques are utilized to first make the pattern-space larger, thus improving scalability; secondly, the disclosed techniques flatten and de-correlate the pattern-space for better accuracy; and thirdly, the techniques to improve invariance and repeatability by including large-scale information on the probability of patterns on content-segments from a single domain.

Following is a general description of the operation of disclosed techniques (realized by the system and methods discussed below) according to one embodiment. A Cortex is a function F: $S_0 \rightarrow S_n$, where for any k $\{k=0, 1, \ldots n\}$, $S_k$ is a pattern-space, which includes one or more patterns. The initial pattern-space $S_0$ is defined by the input patterns; each following symbol-space, which is the next layer of a Cortex, is defined and created by an "iteration function $F_k$" $F_k$: $S_k \rightarrow S_{k+1}$ which converts any set of patterns in $S_k$ to a set of patterns in $S_{k+1}$ according to one or more predefined conversion rules. The conversion rules in any "iteration function" are generated according to the distribution of patterns in a large-scale collection of patterns, such as content-segments, from a certain domain. For example, if a domain of interest is "2D natural photos", some large N descriptors in $S_k$ are generated are denoted $S_0 \ldots S_N$. The content-segments in these examples include 2D images of nature.

According to one embodiment, an iteration for creation of a data layer $F_k$ of a Cortex is defined according to the distribution of patterns in those N descriptors and has several steps. First, $S_{k+1}$ is initialized as a copy of $S_k$. Then, $S_1 \ldots S_N$ are used to build a collection of common combinations of patterns in $S_k$, denoted $\{c_i \subset S_k\}$, where $\subset$ is a subset function. Then, for each combination $c_i$ $\{i=1, 2, \ldots, N\}$ where its probability in $S_1 \ldots S_N$ is larger than a first threshold $T_1$, a new label is added to $S_{k+1}$, thus increasing the space by one. For each "original label" in $S_k$ having a probability in $\{S_1 \ldots S_N\}$ that is larger than a second threshold $T_2$, the respective "original label" is removed from $S_{k+1}$. Finally, for each "original label" in $S_k$ where the number of combinations $c_i$ in which the respective "original label" is included is larger than a third threshold $T_3$, then that respective "original label" is removed from $S_{k+1}$. Typically the thresholds $T_1$, $T_2$ and $T_3$ are numerical values representing a certain probability, examples of which are discussed herein.

At the completion of this process a consistent definition of the data layer $F_k$ is achieved, where each pattern in $S_{k+1}$ is either a pattern in $S_k$ or strongly defined as a collection of patterns in $S_k$, thereby testing for the collection indicates whether the new pattern should be included. The result is that $S_{k+1}$ is a larger signature-space, where patterns that are very common have been removed and/or replaced with combinations of other patterns.

The threshold parameters $T_1$, $T_2$ and $T_3$ should be carefully tuned, so as not to lose valuable patterns, and at the same time to avoid inclusion of "noisy" patterns. The hierarchical process can be repeated any desired number of times, with any choice of thresholds, for as long as the length decreases and the number of unique symbols used increases. Each iteration creates a data layer which is a more compact representation of the immediately preceding data layer. That is, a plurality of symbols of the respective input patterns are mapped to a single symbol.

In one embodiment, the input patterns or data is unique to a domain, for example, text in English, human faces, classical music, and so on. In another embodiment, any combination of data from domains can be used. According to an embodiment, symbols are joined if they have a high correlation. However, symbols can also be combined even if they are not correlated by showing a common co-occurrence, i.e., a tendency to appear together without being actually correlated.

It should be appreciated that there are at least two important outcomes to the process described herein. First the process is scalable, that is, after performing the process described herein, the pattern-space is large and balanced, thus the pattern-space can be spread evenly between multiple machines, with each machine handling a sub-range of the pattern-space. Therefore, a "route" strategy can be used for querying rather than query duplication.

Another important outcome of the disclosed process is its accuracy. That is, in the data layer iteration-building process, a set of "real-world" data $S_1 \ldots S_N$ is used to base the necessary statistics. This means that by applying the teachings disclosed herein, more weight is given to patterns that are less popular (and therefore more significant) in a random sample. Thus, assuming that the input content-segments are from the same domain, the generated data layers are used to separate "noisy" patterns from valuable "detection" patterns. Furthermore, the data layers generated according to the disclosed process provide a function that is similar to a brain function in its ability to recognize a pattern as belonging to a higher level concept.

It should be noted that the disclosed pattern recognition process is particularly advantageous in analysis of big-data. Big-data typically refers to a collection of data sets that are large and complex that cannot be analyzed using on-hand database management tools or traditional data processing applications, such as those discussed in the related art. As noted above, the disclosed process results in a pattern-space that is large and balanced, thus the pattern-space can be spread evenly between multiple machines, where each machine handles a sub-range of the pattern-space. Therefore, the disclosed process can be efficiently utilized for big data analysis.

Following are two non-limiting examples for the operation of the process for generating the data layers. In the first non-limiting example, shown in FIG. 1, an original set comprising a sequence of 500 symbols is presented, where there are four (4) different symbols: "R", "G", "B" and "Y". Applying the process described herein, that is, identifying symbols, patterns, or sequences, and applying a threshold value to determine which sequence of symbols are to be replaced by another symbol, results in the table shown in FIG. 2. In this case, the symbol sequences present that are combinations of either three or two symbols, are determined as to the number of appearances in the input sequence. It should be noted that all possibilities of sequences are considered, although not all the sequences are shown in FIG. 2. The longest sequence is the data itself; it appears only one time and is below the required repeated threshold.

According to an exemplary embodiment, the first level table shown in FIG. 2 contains only sequences that appear above a first threshold $T_1$, for example, a threshold value equal to or greater of 10. From those sequences that are above the value $T_1$, only those having a longer sequence, if contained within the sequence shown in the table, are to be used for symbol replacement. For example, the sequences "BYY" and "YY" are dependent, however, the longer sequence is preferred over the shorter sequence. Therefore, as depicted in FIG. 2, while the sequence "YY" appears 28 times in the input sequence, it appears only 8 times independently, whereas the sequence BYY appears 13 times independently. With a threshold determined to be equal to or greater than 10, the sequence "YY" is not replaced by a substitute symbol, while the sequence "BYY", is replaced by the symbol "A". The resultant sequence after this first iteration of the data layer generation process step is shown in FIG. 3. The sequence presented in FIG. 3 shows an increase in the number of symbols in the symbol-space from 4 symbols to 17 symbols (A, C, D, E, F, H, I, J, K, L, M, N, O, Y, R, G, B) and a corresponding reduction in the number of symbols in the sequence that was reduced from 500 symbols in the initial sequence to 283 symbols in the subsequent sequence.

The process can now continue with performing another iteration to further reduce the number of symbols in the sequence by expanding the symbol space. For the next iteration, the input sequence (shown in FIG. 3) comprises the reduced symbol sequence of 283 symbols. FIG. 4 shows a second level table that is produced using threshold values equal to or greater than 5. As a result, certain sequences of symbols are each replaced by a corresponding single symbol, thereby reducing the number of symbols in the output sequence to 262 symbols with a symbol space of 20 (A, C, D, E, F, H, I, J, K, L, M, N, O, Y, R, G, B, P, S, T). The resulting output sequence of the second iteration is shown in FIG. 5.

Yet another iteration is performed by the disclosed process where a threshold value equal to or greater than 3 is shown in the table of FIG. 6, and the resultant reduced sequence of symbols is shown in FIG. 7. As can be noticed from the symbols listed in the "Replace Symbol" column in FIG. 6, the symbol-space is increased to 37 symbols. The output symbol sequence (FIG. 7) is reduced to a length of 221 symbols, i.e., less than half of the original length of 500 symbols. It should be noted that each set of sequences generated at each iteration (as shown in FIGS. 3, 5, and 7) is referred to as a data layer or a Cortex layer (a data layer of the Cortex).

Therefore, according to the disclosed embodiments, with respect of the creation of data layers for the example above, it is understood that at the entry data layer, there is a set of symbol sequence of 500 symbols, using a symbol-space of 4. In the second data layer, after the first data layer processing, there is a sequence of symbols containing 283 symbols, using a symbol-space of 17. In a third data layer, after the second data layer processing, there is a sequence of symbols containing 262 symbols, using a symbol-space of 20. Lastly, in the fourth data layer, after the third data layer processing, there is a sequence of symbols containing 221 symbols, using a symbol-space of 37.

In one embodiment, symbols may be replaced by signatures, such as those described in U.S. Pat. Nos. 8,112,376, 8,266,185, 8,312,031 and 8,326,775, 8,655,801, and 8,386, 400, all assigned to common assignee and are hereby incorporated by reference for all that they contain.

In a second non-limiting example for the operation of the disclosed data layer generation process, four image symbols, a line 810, a square 820, a circle 830 and a triangle 840, are shown in FIGS. 8A through 8D respectively, and used according to an embodiment. Combinations of the basic image symbols 810, 820, 830 and 840 may result in various higher level images symbols, a house 910 or a chair 920, shown in FIGS. 9A and 9B respectively, and used according to an embodiment. The image symbol of a house 910 is comprised of a square 820-1 and a triangle 840-1 combined in a specific way, recognized as a symbol image of a "house". Similarly, the image symbol of a chair 920 is comprised of four symbols of lines 810-1, 810-2, 810-3, and 810-4 combined in a specific way, recognized as a symbol image of a "chair".

According to one embodiment, any one of the basic four image symbols 810, 820, 830 and 840 are connectable to another basic image symbol 810, 820, 830 or 840 at a connecting port. An exemplary and non-limiting designation of connection ports, each port numbered to differentiate it from another port, is shown in FIGS. 10A through 10D respectively. For example, but not by way of limitation, the line 1010 has three ports numbered 1, 2, and 3, while the square 1020 has eight ports numbered 1, 2, 3, 4, 5, 6, 7, and 8, and so on.

It should be understood that the number of connection ports assigned for each basic image symbol 1010, 1020, 1030, and 1040 are merely examples and each image symbol may be comprised of less or more connection ports. Each image symbol is further designated, for example, by an identification character, for example, the line has the character "A", the square, "B", the circle, "C", and the triangle "D". The upper level image of a "house" shown in FIG. 9A could therefore be compactly described as:

$$D(4)<0°>B(2)$$

This means that the image symbol "D" connects to the image symbol "B" at ports "4" and "2" respectively, and at a relative orientation of 0°. Similarly, the upper level image of a "chair" shown in FIG. 9B could therefore be compactly described using the following notation:

$$A(3)<[0°>A(1),90°>A(1),(3)<90°>A(1)]$$

This means that an image symbol "A" is connected through port 3 to port 1 of another image symbol "A" with a relative orientation of 0°, and to port 1 of another image symbol "A" with a relative orientation of 90°, which in turn is connected through its port 3 to port 1 of another image symbol "A" with a relative orientation of 90°.

According to one embodiment, a pattern identification and extraction is thereby possible as a result of the data layers (Cortex). FIGS. 11A, 11B and 11C depict three upper level symbols 1110 of a "man", 1120 of a "woman" and 1130 of a "dog", each comprised of the basic image symbols shown in FIG. 10. Therefore, using the notation described above, the symbol of a "man" 1110 can be described as:

$$C(6)<90°>A(1),(2)<0°>A(2)$$

The symbol of a "woman" 1120 can be described as:

$$C(6)<90°>A(1),(3)<0°>D(1)$$

And, the symbol of a "dog" 1130 can be described as:

$$C(6)<90°>A(1),(2)<0°>A(1),(3)<90°>A(2)$$

According to one embodiment, a common pattern is extracted, comprising a basic symbol of a circle "C" connecting via a connection port '6' to a symbol of a line "A" at port '1' in a relative orientation of 90°. Hence, the extracted common pattern can be described as:

$$C(6)<90°>A(1)$$

Then, the identified pattern receives a symbol within the data layer in which it was found. For example, the symbol Ω replaces the extracted common pattern $C(6)<90°>A(1)$. Therefore, the symbol of a "man" 1110 could be described in the current data layer as:

$$\Omega(2)<0°>A(2)$$

The symbol of a "woman" 1120 could be described in the current data layer as:

$$\Omega(3)<0°>D(1)$$

And, the symbol of a "dog" 1130 can be described in the current data layer as:

$$\Omega(2)<0°>A(1),(3)<90°>A(2)$$

Therefore, using the disclosed process, the number of symbols has increased in this data layer. However, the data set itself is shorter. In one embodiment, a data layer comprises at least the collection of symbols used in an immediate previous data layer. Furthermore, in the above example, $C(6)<90>A(1)$ is a common pattern. This means that the probability is that the combination $C(6)<90>A(1)$ is larger than a first threshold $T_1$. Thus, a new label Ω is added to $S_{k+1}$, hence increasing the space by one. The probability is now that each element in the combination, C and A, is larger than a second threshold $T_2$, thus the respective "original labels" (C and A) are removed from $S_{k+1}$. Therefore, as can be understood the thresholds utilized in the disclosed process are based on the certain probabilities that an element will be found in the subsequent data layer.

Figure 12:
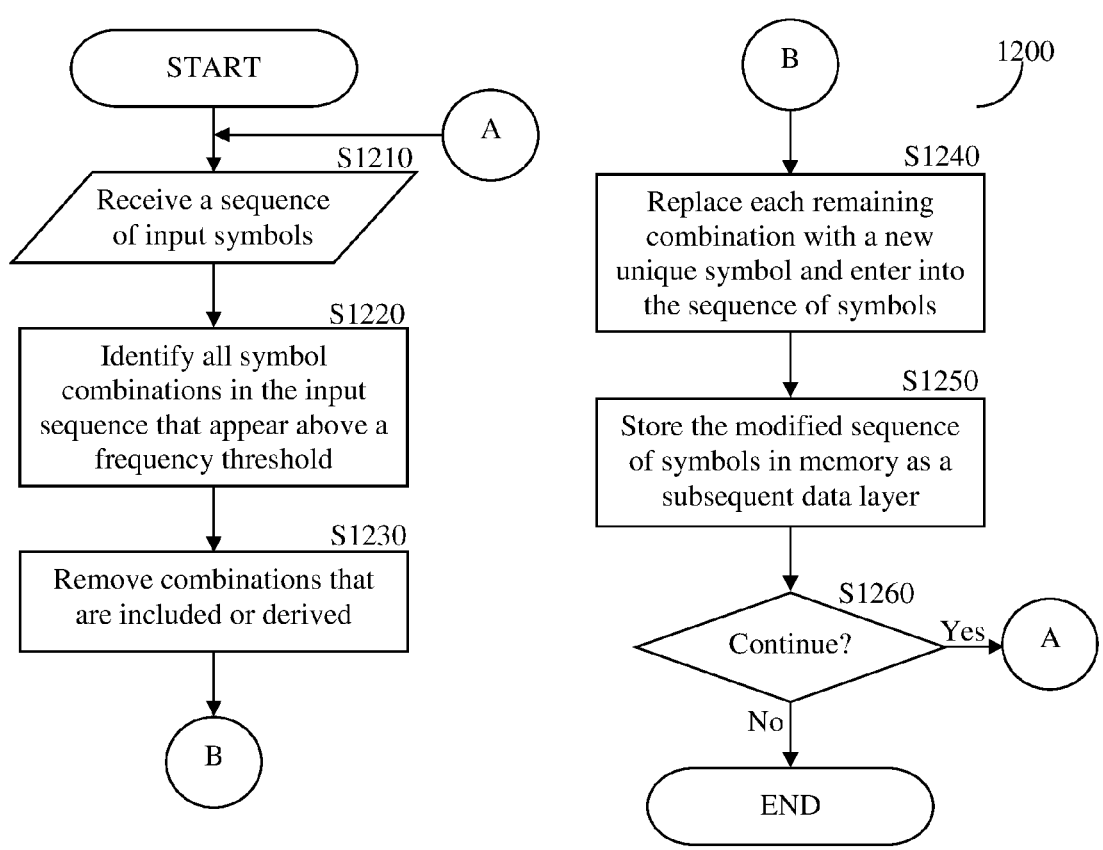
FIG. 12 is a flowchart depicting the creation of a data layers responsive of an input of a sequence of input symbols for achieving symbol-space based compression of patterns according to one embodiment.

FIG. 12 shows an exemplary and non-limiting flowchart 1200 that depicts the creation of a data layer responsive of an input sequence of input symbols according to one embodiment. In S1210, an input including a sequence of symbols is received. The symbols may be characters, images, sounds, video and other input sequences, including representations of signals, and the like.

In one embodiment, the sequence includes a set of signatures generated for multimedia content elements. Such signatures are generated as discussed, for example, in the above-referenced U.S. Pat. Nos. 8,112,376, 8,266,185, 8,312,031, 8,655,801, and 8,386,400.

In S1220, all symbol combinations, i.e., two or more symbols that appear in a frequency (a number of appearances) that is above a predetermined threshold are identified. In S1230, included and derived combinations of symbol combinations identified in S1220 are removed. In one embodiment, this further entails the use of an additional threshold (e.g., threshold $T_2$ discussed above) to further filter the resultant symbol combinations used. For example, the symbol sequence 'YYR' is identified in the input sequence (FIG. 1) as depicted in FIG. 2, but is not included in the resultant data layer.

In S1240, the remaining symbol combinations are each replaced by a unique new symbol. In one embodiment, the remaining symbol combinations are those for which the number of appearances in the input sequence is above the predefined threshold used to filter symbol combinations. In S1250, the resultant sequence of symbols is stored in memory as a data layer that is subsequent to the input data layer.

In S1260, it is checked whether an additional data layer is to be derived, for the last generated data layer, and if so, execution continues with S1210, where the new input of a sequence of symbols is that which was stored in memory in S1250; otherwise, execution terminates.

Figure 13:
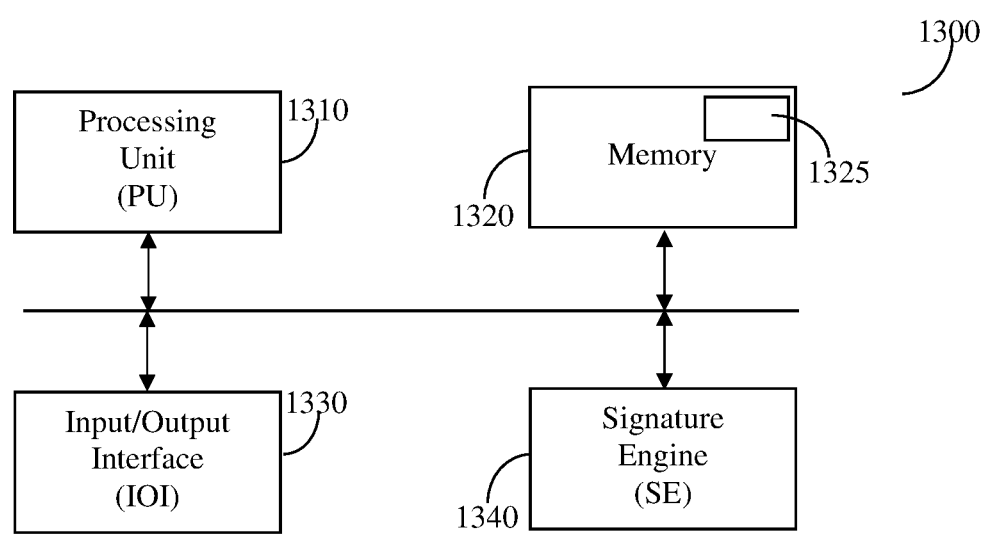
FIG. 13 is a system for creation of data layers responsive of an input sequence of input symbols for achieving symbol-space based compression of patterns according to one embodiment.

FIG. 13 shows an exemplary and non-limiting system 1300 for creation of data layers responsive of an input sequence of input symbols according to one embodiment. The system 1300 includes a processing unit (PU) 1310 that may comprise one or more processing elements, such as a computational core. The PU 1310 is communicatively connected to a memory 1320. The memory 1320 may be comprised of both volatile and non-volatile memory, and may further be in proximity or remote from the PU 1310. The memory 1320 contains instruction in a memory portion 1325, that when executed by the PU 1310 performs at least the data layer generation process described in detail above, for example, with respect of flowchart 1200.

The sequence of input symbols may be provided from an external source via the input/output interface 1330 that is communicatively coupled to the PU 1310, or from the memory 1320. The input sources to generate the data layers include, but are not limited to, sensory sources such as audio, video, touch, smell, text, and so on. Moreover, combinations of different input data sources are also possible.

In one embodiment, the system 1300 also includes a signature generator 1340 that is communicatively connected to the PU 1310 and/or the memory 1320. The signature generator 1340 may generate signatures respective of the data provided through one or more sources connected to the input/output interface 1330. The generated signatures are then processed by the PU 1310 to generate the data layers. An exemplary implementation for the signature generator 1340 and its functionality can be found in at least the above-referenced U.S. Pat. Nos. 8,112,376, 8,266,185, 8,312,031 and 8,326,775, 8,655,801, and 8,386,400.

A data layer maintains several properties. A higher-level data layer demonstrates a greater symbol-space, i.e., space increases as new layers are generated. The data layer also maintains the probability of symbols being closer increases while correlation between the symbols decreases. Symbols that are close to each other before the layering process are also close after the process is performed.

According to another embodiment, the data layer maintains invariance, that is, two symbols that are complementary maintain an invariant property. For example, if the input data (sequence of symbols) is a face, the generated data layers are invariant with respect of a closed eye or an open eye of the same face. The generation of data layers comprises common patterns, which are combinations of input patterns from different sources. The output of a data layer is a fusion of information from multiple sources represented by a generic set of indices.

According to another embodiment, all the properties of a data layer are important in the generated layer. That is, if, for example, an audio source is too dominant compared to video the layer suppresses the audio patterns by generating relevant common patterns. Moreover, if two data sources are correlated, the layer generates a de-correlated fused representation.

The various embodiments disclosed herein can be implemented as hardware, firmware, software or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

All examples and conditional language recited herein are intended for pedagogical purposes to aid the reader in understanding the disclosed embodiment and the concepts contributed by the inventor to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A method for symbol-space based pattern compression, comprising:
   identifying a plurality of basic image symbols in an input sequence;
   assigning, to each of the plurality of basic image symbols, at least one connecting port;
   generating an output sequence by replacing each identified basic image symbol with an identification symbol, wherein the output sequence indicates connections between pairs of the plurality of basic image symbols based on the connecting ports, wherein each identification symbol is not a previously used symbol; and
   storing the output sequence as a data layer.

2. The method of claim 1, further comprising:
   identifying each connection between each pair of the plurality of basic image symbols, each pair including a first basic image symbol and a second basic image symbol;
   determining, for each connection, a first connecting port of the first basic image symbol and a second connecting port of the second basic image symbol, wherein the first basic image symbol is connected to the second basic image symbol through the first connecting port and the second connecting port, respectively.

3. The method of claim 2, further comprising:
   assigning a connecting port symbol for each connecting port, wherein the output sequence includes the respective connecting port symbols of each connection.

4. The method of claim 2, wherein the output sequence further indicates, for each connection, an orientation of the first basic image symbol relative to the second basic image symbol.

5. The method of claim 4, further comprising:
   identifying at least one common pattern in the input sequence, wherein each common pattern includes at least two basic image symbols; and
   replacing each identified common pattern with a pattern identifier symbol, wherein each pattern identifier symbol is not a previously used symbol.

6. The method of claim 5, wherein each common pattern further includes at least one of the identified connections.

7. The method of claim 1, wherein each identified basic image symbol appears in the input sequence above a predetermined threshold number of times.

8. The method of claim 1, wherein each identification symbol is a signature.

9. The method of claim 8, further comprising:
generating, for each basic image symbol, a signature, wherein the signature is the identification symbol for the basic image symbol.

10. A non-transitory computer readable medium having stored thereon instructions for causing one or more processing units to perform the following steps:
identify a plurality of basic image symbols in an input sequence;
assign, to each of the plurality of basic image symbols, at least one connecting port;
generate an output sequence by replacing each identified basic image symbol with an identification symbol, wherein the output sequence indicates connections between pairs of the plurality of basic image symbols based on the connecting ports, wherein each identification symbol is not a previously used symbol; and
store the output sequence as a data layer.

11. A system for symbol-space based pattern compression, comprising:
a processing unit; and
a memory, the memory containing instructions that, when executed by the processing unit, configure the system to:
identify a plurality of basic image symbols in an input sequence;
assign, to each of the plurality of basic image symbols, at least one connecting port;
generate an output sequence by replacing each identified basic image symbol with an identification symbol, wherein the output sequence indicates connections between pairs of the plurality of basic image symbols based on the connecting ports, wherein each identification symbol is not a previously used symbol; and
store the output sequence as a data layer.

12. The system of claim 11, wherein the system is further configured to:
identify each connection between each pair of the plurality of basic image symbols, each pair including a first basic image symbol and a second basic image symbol;
determine, for each connection, a first connecting port of the first basic image symbol and a second connecting port of the second basic image symbol, wherein the first basic image symbol is connected to the second basic image symbol through the first connecting port and the second connecting port, respectively.

13. The system of claim 12, wherein the system is further configured to:
assign a connecting port symbol for each connecting port, wherein the output sequence includes the respective connecting port symbols of each connection.

14. The system of claim 12, wherein the output sequence further indicates, for each connection, an orientation of the first basic image symbol relative to the second basic image symbol.

15. The system of claim 14, wherein the system is further configured to:
identify at least one common pattern in the input sequence, wherein each common pattern includes at least two basic image symbols; and
replace each identified common pattern with a pattern identifier symbol, wherein each pattern identifier symbol is not a previously used symbol.

16. The system of claim 15, wherein each common pattern further includes at least one of the identified connections.

17. The system of claim 11, wherein each identified basic image symbol appears in the input sequence above a predetermined threshold number of times.

18. The system of claim 11, wherein each identification symbol is a signature.

19. The system of claim 18, wherein the system is further configured to:
generate, for each basic image symbol, a signature, wherein the signature is the identification symbol for the basic image symbol.

* * * * *